United States Patent [19]

Doan et al.

[11] Patent Number: 5,346,587
[45] Date of Patent: Sep. 13, 1994

[54] PLANARIZATION OF A GATE ELECTRODE FOR IMPROVED GATE PATTERNING OVER NON-PLANAR ACTIVE AREA ISOLATION

[75] Inventors: Trung T. Doan, Kuna; Charles H. Dennison, Boise, both of Id.

[73] Assignee: Micron Semiconductor, Inc., Boise, Id.

[21] Appl. No.: 105,276

[22] Filed: Aug. 12, 1993

[51] Int. Cl.$^5$ ............... H01L 21/306; B44C 1/22; C23F 1/00; C03C 15/00
[52] U.S. Cl. ................... 156/657; 156/656; 156/659.1; 156/662; 437/192; 437/193; 437/233
[58] Field of Search ............... 437/192, 193, 233; 156/656, 657, 659.1, 662

[56] References Cited

U.S. PATENT DOCUMENTS

| | | | |
|---|---|---|---|
| 4,966,868 | 10/1990 | Murali et al. | 437/193 |
| 5,030,584 | 7/1991 | Nakata | 437/193 X |
| 5,037,772 | 8/1991 | McDonald | 437/233 X |
| 5,264,076 | 11/1993 | Cuthbert et al. | 437/233 X |

*Primary Examiner*—William Powell
*Attorney, Agent, or Firm*—David J. Paul

[57] ABSTRACT

The present invention is a process for providing a planarized transistor gate on a non-planar starting substrate, by depositing a layer of planarized conductive polysilicon material overlying neighboring field oxide isolation regions such that the height of the conductive polysilicon material extends above the topology of the field oxide isolation regions; depositing a layer of conductive silicide material superjacent and coextensive the conductive polysilicon material; and then patterning the planarized conductive polysilicon material and the conductive silicide material thereby forming the planarized transistor gate.

19 Claims, 5 Drawing Sheets

PLANARIZATION OF A GATE ELECTRODE FOR IMPROVED GATE PATTERNING OVER NON-PLANAR ACTIVE AREA ISOLATION

FIELD OF THE INVENTION

This invention relates to semiconductor fabrication process and more particularly to a process for gate patterning over an active area isolation.

BACKGROUND OF THE INVENTION

During semiconductor fabrication a conventional process starts with a wafer substrate 10, as depicted in FIG. 1, that has patterned thin oxide layers 12 separating isolation regions of thick (or field) oxide 11. In the process depicted in FIG. 1, during exposure and patterning of photoresist 15 via reticle 16, light can reflect off of the uneven topology of silicide 14 and cause what is know as reflective notching. The reflective notching in the photoresist pattern is then transferred into the underlying conductive layer following a subsequent etch.

As seen from the top view of FIG. 2, a conductive strip 21 shows the results of reflective notching during the exposure of the photoresist that has caused some of the conductive strip to be removed during the etching of the strip. In this case the conductive strip 21 has been patterned over active area 22 to serve as a control gate to an MOS device. It becomes obvious that this reflective notch is undesirable as it would reduce the reliability of the MOS device.

The present invention addresses the reflective notching problem by forming a planarized conductor on a wafer's surface that has a uneven topology that results from the formation of spaced apart, patterned oxide isolation regions including oxide regions formed by LOCOS trench isolation and other advanced isolation technologies.

SUMMARY OF THE INVENTION

The present invention is realized in a process for providing a planarized conductor on a non-planar starting substrate, by:

a) forming a first layer of planarized conductive material overlying neighboring isolation regions such that the height of the conductive material extends above the topology of the isolation regions; and b) patterning the first and second conductive material thereby forming the planarized conductor.

DETAILED DESCRIPTION OF THE INVENTION

Figure 1:
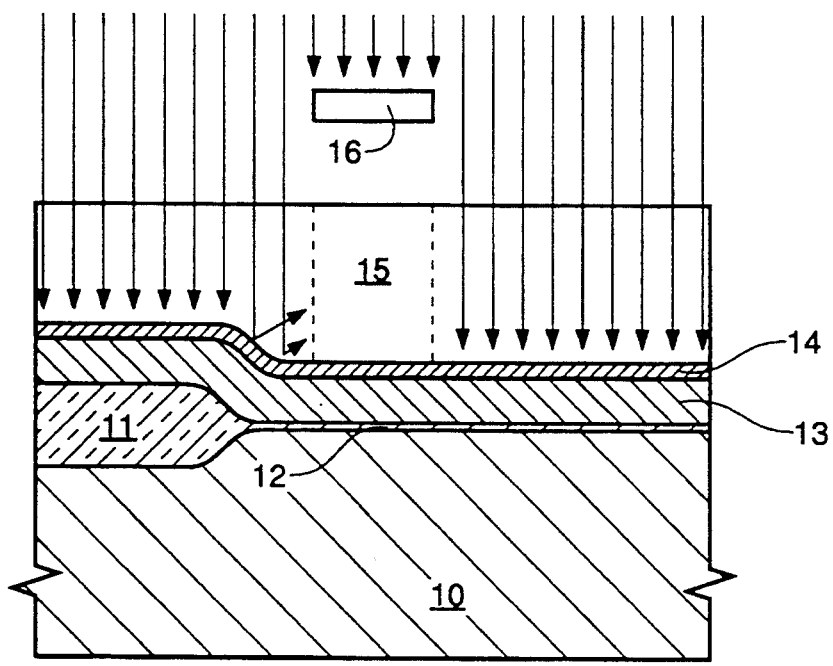
FIG. 1 is a composite cross-sectional view of an in-process wafer portion depicting a conventional method used to pattern a gate electrode between field oxide isolation regions.
Figure 2:
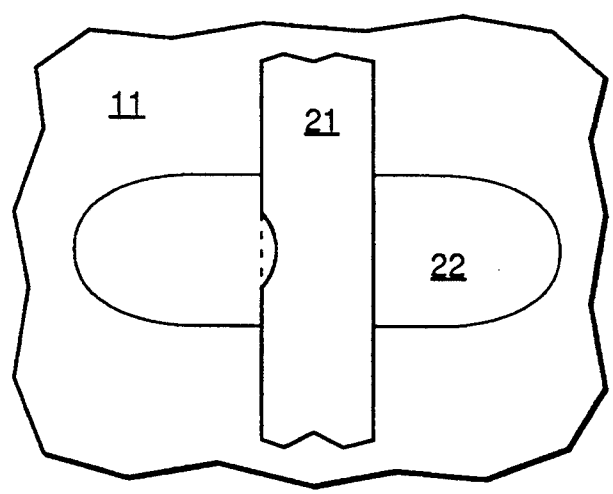
FIG. 2 is an overhead view of the results of the process steps of FIG. 1 wherein reflective notching is demonstrated.
Figure 3:
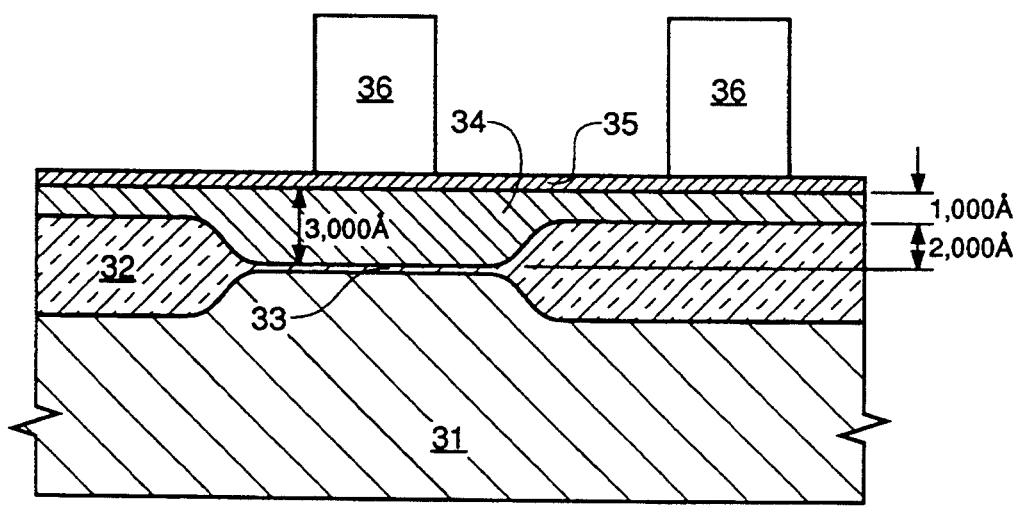
FIG. 3 is a composite cross-sectional view of an in-process wafer portion depicting a silicide layer overlying a planarized polysilicon which in turn overlies a starting substrate.

In a preferred embodiment and referring now to FIG. 3, a silicon substrate 31, has patterned thick oxide isolation regions 32 (formed by a LOCOS isolation), spaced apart by a thin oxide film 33 (i.e. grown gate oxide). Next, a thick layer of conductively doped polysilicon 34 is formed overlying thick oxide regions 32 and thin oxide film 33. In this example, thick oxide region extends approximately 2000Å above the substrate's surface. Therefore, polysilicon 34 must be thick enough whereby its thickness extends substantially above the 2000Å height of the thick oxide 32. In this case, after planarization of polysilicon 34, 1000Å of polysilicon 34 remains to overlie thick oxide 32. Next a layer of reflective material 35, such as silicide (i.e. tungsten silicide, titanium silicide, etc.) or metal is formed over planarized polysilicon 34. The higher the capability material 35 has to reflect the photolithographic light during subsequent patterning of planarized conductive strips the less susceptible are the patterned conductive strips to reflective notching.

Referring now to FIG. 4, planarized polysilicon 34 and silicide 35 are patterned to form planarized conductive strips 41 that will serve as (planarized) control gates to a MOS transistor.

Figure 4A:
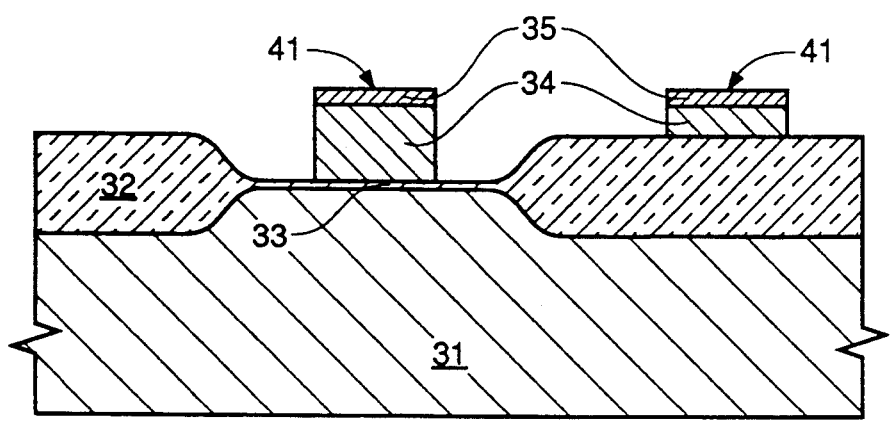
FIG. 4A is a composite cross-sectional view of the in-process wafer portion of FIG. 3 depicting the results of an etch.
Figure 4B:
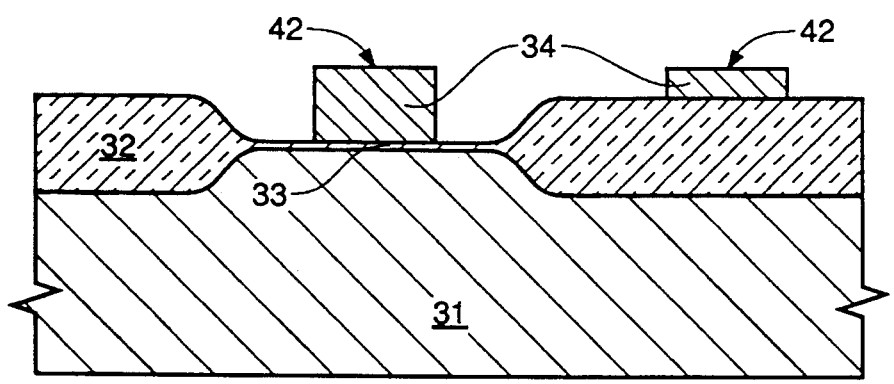
FIG. 4B is a composite cross-sectional view of an in-process wafer portion depicting a planarized conductive control gates made of a single planarized polysilicon layer overlying a starting substrate.

As an alternative to FIGS. 3 and 4a, FIG. 4b show planarized conductive strips 42 that is formed out of polysilicon only.

Figure 4C:
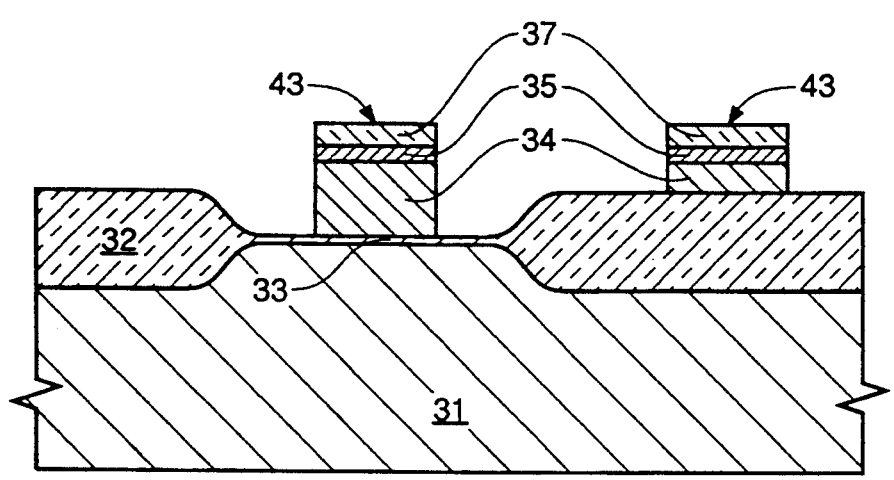
FIG. 4C is a composite cross sectional view of an in-process wafer portion depicting a planarized conductive control gate made of planarized polysilicon, silicide and partially reflective insulator layers overlaying a staring substrate.

As another alternative to FIGS. 3 and 4a, FIG. 4c show planarized conductive strips 43 that are formed out of polysilicon 34, silicide 35 and a partially reflective insulator 37 (such as nitride).

Figure 5:
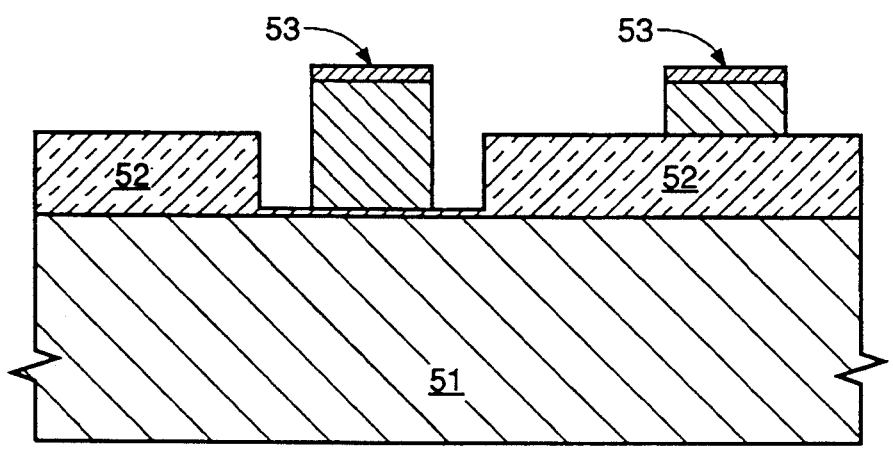
FIG. 5 is a composite cross-sectional view of the in-process wafer portion utilizing the process steps of the present invention in a second embodiment.

FIG. 5 shows a second embodiment depicting the use of the process steps of the present invention wherein a thick oxide is patterned and etched to form thick blocks of isolation oxide 52 that is spaced apart by a thin gate oxide 51 that results from the etching of thick oxide 52. To form gate oxide 51, the thick oxide is etched to bare silicon and then a thin gate oxide is thermally grown on silicon 31. The process steps than follow those discussed in FIGS. 3 and 4 and to form resultant planarized conductive strips 53 that will serve as (planarized) control gates to a MOS transistor.

Figure 6:
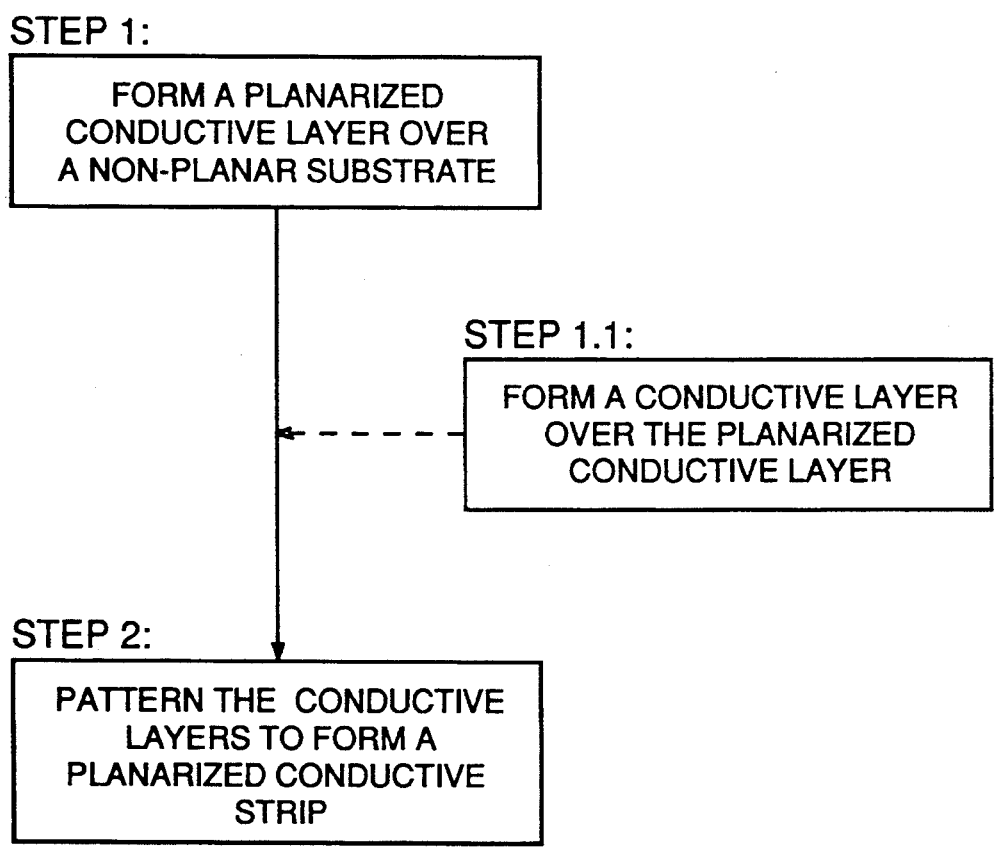
FIG. 6 is a flow diagram depicting the process steps of the present invention.

FIG. 6 is a flow diagram depicting the general process steps of the present invention described above wherein; Step A comprises forming a planarized conductive layer over an non-planar substrate; Alternate Step B comprises forming a second conductive layer on the planarized conductive layer of Step A; and Step C comprises patterned the conductive layers of Steps A and C to form a planarized conductor.

From the process steps described in the two embodiments above, one skilled in the art could utilize these steps to form planarized conductive strips on an nonplanarized surface wherein the conductive strips comprise various conductive materials including multiple doped polysilicon layers, metal layers and any combination thereof.

Therefore, it is to be understood that although the present invention has been described with reference to several embodiments, various modifications, known to those skilled in the art, may be made to the structure and process steps presented herein without departing from the invention as recited in the several claims appended hereto.

What is claimed is:

1. A process for providing a planarized conductor on a non-planar starting substrate, said process comprising the steps of:

forming a layer of planarized conductive material overlying neighboring isolation regions such that the height of said conductive material extends above the topology of said isolation regions;

forming a layer of reflective material superjacent and coextensive said planarized conductive material; and patterning said conductive material thereby forming said planarized conductor.

2. The process of claim 1, wherein said reflective material comprises a layer of reflective conductive material.

3. The process of claim 1, wherein said reflective material comprises a layer of partially reflective insulative material.

4. The process of claim 1, wherein said layer of planarized conductive material is planarized by chemical mechanical polishing.

5. The process of claim 1, wherein said layer of planarized conductive material comprises conductively doped polysilicon.

6. The process of claim 2, wherein said layer of reflective conductive material comprises a material selected from the group of metal silicides and metals.

7. The process of claim 6, wherein said metal silicides comprise the group of tungsten silicide and titanium silicide.

8. The process of claim 3, wherein said partially reflective insulating material comprises nitride.

9. A process for providing a planarized transistor gate on a non-planar starting substrate, said process comprising the steps of:

forming a layer of planarized conductive material overlying neighboring isolation regions such that the height of said conductive material extends above the topology of said isolation regions;

forming a layer of reflective material superjacent and coextensive said planarized conductive material; and patterning said conductive material thereby forming said thereby forming said planarized transistor gate.

10. The process of claim 9, wherein said layer of reflective material comprises reflective conductive material.

11. The process of claim 9, wherein said reflective material comprises a layer of partially reflective insulative material.

12. The process of claim 9, wherein said layer of planarized conductive material is planarized by chemical mechanical polishing.

13. The process of claim 9, wherein said layer of planarized conductive material comprises conductively doped polysilicon.

14. The process of claim 10, wherein said layer of reflective conductive material comprises a material selected from the group of metal silicides and metals.

15. The process of claim 14, wherein said metal silicides comprise the group of tungsten silicide and titanium silicide.

16. The process of claim 11, wherein said partially reflective insulating material comprises nitride.

17. The process of claim 9, wherein said layer of planarized conductive material comprises in-situ conductively doped polysilicon.

18. The process of claim 9, wherein said layer of planarized conductive polysilicon material is approximately 3000Å thick.

19. The process of claim 9, wherein said layer of planarized conductive polysilicon material has a thickness of approximately 1000Å overlying said field oxide.

* * * * *